(12) United States Patent
Sekigawa et al.

(10) Patent No.: US 7,307,691 B2
(45) Date of Patent: Dec. 11, 2007

(54) MASKLESS DIRECT EXPOSURE SYSTEM AND USER INTERFACE

(75) Inventors: Kazunari Sekigawa, Nagano (JP); Toshinori Koyama, Nagano (JP); Kazutaka Kobayashi, Nagano (JP); Masatoshi Akagawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 470 days.

(21) Appl. No.: 10/974,327

(22) Filed: Oct. 27, 2004

(65) Prior Publication Data

US 2005/0094120 A1 May 5, 2005

(30) Foreign Application Priority Data

Oct. 30, 2003 (JP) ............................. 2003-370593

(51) Int. Cl.
*G03B 27/46* (2006.01)
*G03B 27/42* (2006.01)

(52) U.S. Cl. .......................................... 355/54; 355/53

(58) Field of Classification Search .................. 355/54, 355/53
See application file for complete search history.

(56) References Cited

U.S. PATENT DOCUMENTS 6,544,698 B1 * 4/2003 Fries ............................ 430/22

FOREIGN PATENT DOCUMENTS

JP 10-112579 4/1998

\* cited by examiner

*Primary Examiner*—Diane Lee
*Assistant Examiner*—Chia-how Michael Liu
(74) *Attorney, Agent, or Firm*—Joseph A. Calvaruso; Chadbourne & Parke LLP

(57) ABSTRACT

A direct exposure system comprises: a data mask that is a data object including drawing data; and a control mask that is a data object including at least one logical layer in which information about exposure conditions applied according to regions on a substrate is specified, and performs a direct exposure process using integrated data generated by combining the data mask with the control mask.

22 Claims, 9 Drawing Sheets

MASKLESS DIRECT EXPOSURE SYSTEM AND USER INTERFACE

BACKGROUND OF THE INVENTION

1. Field of the Invention

The present invention relates to a direct exposure system that performs a direct exposure process, using drawing data, for forming a desired exposure pattern on a substrate and a user interface that allows the direct exposure system to perform the direct exposure process using the drawing data for forming the desired exposure pattern on the substrate in the manufacture of circuit boards or semiconductor devices.

2. Description of the Related Art

In manufacturing processes of circuit boards, a desired pattern is formed by forming a resist film that is a photosensitive resin film on a substrate, exposing the resist in the desired pattern and, then, performing an etching process on the substrate.

In an exposure process using photomasks, as a substrate on a stage and a photomask are aligned with each other mechanically by moving them relatively, accuracy is degraded.

Typically, in an exposure process, as the effects of physical and chemical parameters are profound, the substrate in exact accordance with drawing data cannot always be obtained after the exposure. For example, as the substrate itself may expand, shrink or distort due to ambient temperature of the substrate, mechanical stress applied to the substrate and the like, it is necessary to empirically optimize different process conditions (i.e., to empirically make adjustments of different process conditions) so that the desired pattern can be obtained by remaking photomasks of different layouts several times in consideration of such expansion, shrinkage or distortion.

Further, before mass production, in order to obtain optimal values for various conditions such as the dose of exposure, the exposure speed, the focus of light sources and so on (hereinafter referred to as "exposure conditions"), a set of inspections called "optimization" must be performed repeatedly to determine the optimal exposure conditions.

However, in the exposure process using the photomasks, as the photomasks are needed even at the experimental stage, where inspections are repeated many times, not to mention in the mass production of substrates, it is costly and very uneconomical to manufacture the masks.

For the reason described above, in recent years, a direct exposure (or maskless exposure) method without using photomasks has been proposed.

According to the direct exposure method, the drawing data can be corrected easily according to the distorted substrate and, therefore, improvements can be made such as increase in manufacturing accuracy, increase in yield, shortening of delivery times, reduction of manufacturing cost and so on.

Examples of the direct exposure method include a technique set forth in Japanese Unexamined Patent Publication No. 10-112579. According to this technique, when a resist formed on a substrate is exposed, pattern data is generated according to a pattern to be exposed, then, this pattern data is input to Digital Micromirror Device (DMD), a plurality of micro mirrors of DMD are tilted according to the pattern data and, then, light is projected on DMD so that the resist is illuminated by the light reflected from the micro mirrors and exposed in a shape according to the pattern data.

In either the exposure method using the photomasks or the direct exposure method without using the photomasks, the exposure process is performed with regard to given drawing data under certain constant conditions. In other words, the exposure conditions applied to exposing one substrate are always constant.

Therefore, in the process for determining the exposure conditions (conditioning) before the start of mass production of the exposed substrates, in order to test various exposure conditions and determine optimal exposure conditions, a large number of substrates must be exposed even in the direct exposure method, not to mention in the exposure method using the photomasks.

In comparison with the exposure method using the photomasks, the direct exposure method is inexpensive in terms of cost because it does not use the photomasks, but both methods are similar in that a plurality of substrates must be exposed in the process for determining the exposure conditions and, therefore, they are not cost-effective. Further, as the exposure conditions must be set again every time the exposure of one substrate to which certain exposure conditions are applied is completed, these methods take effort and time. Still further, not only in the process for determining the exposure conditions, but also in other processes, it is convenient if the necessary exposure conditions can be set for the exposure devices easily in a short time.

In view of the above problems, it is an object of the present invention to provide a direct exposure system and a user interface that can facilitate determination and setting of exposure conditions.

SUMMARY OF THE INVENTION

In order to achieve the above object, in the present invention, a data object, which contains various information about exposure conditions, is defined as a virtual mask. Then, a direct exposure process is performed according to integrated data obtained by superimposing this virtual data on drawing data, which is originally input to an exposure system. In this specification, the virtual mask that is a data object in which various information about exposure conditions is specified is particularly referred to as a control mask. Further, a data object including the drawing data is referred to as a data mask.

FIG. 1 is a conceptual diagram for describing a principle of a direct exposure system according to the present invention. Hereinafter, like components are designated by like reference numerals in different views.

A direct exposure system 1 according to the present invention comprises: a data mask 11 that is a data object including drawing data; and a control mask 12 that is a data object including at least one of logical layers 20-1, 20-2 and 20-3 in which information about exposure conditions applied according to regions on a substrate 2 is specified. The direct exposure system 1 performs a desired direct exposure process using integrated data 13 generated by combining the data mask 11 with the control mask 12.

By defining the virtual masks as described above, there is provided a user interface for the direct exposure system through which an intuitively understandable image can be obtained as if one virtual mask in which manufacturing conditions are specified (that is, the control mask 12) and the other virtual mask including original drawing data (that is, the data mask 11) are superimposed on each other and, then, light emitted from a light source 3 is applied from above and a desired pattern is formed on the substrate 2 through these two superimposed masks.

In this connection, though the control mask 12 includes the three layers 20-1, 20-2 and 20-3 in FIG. 1, the present invention is not limited to such configuration and the control mask 12 may be configured to include at least one layer.

When pieces of geometrical information corresponding to regions obtained by dividing a plane of the substrate 2 are defined as windows 19-*a*, 19-*b* and 19-*c*, pieces of information about the exposure conditions applied to such windows 19-*a*, 19-*b* and 19-*c* are specified in the layers 20-*a*, 20-2 and 20-3.

In this connection, though the windows 19-*a*, 19-*b* and 19-*c* are provided in the layers 20-1, 20-2 and 20-3, respectively, and one by one in FIG. 1, each layer may have a plurality of windows or the windows may be disposed over an entire window.

Further, it is desirable that plural types of layers, which contain information about the exposure conditions applied to each window, are prepared in advance.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

In a direct exposure system, in an embodiment of the present invention, a control mask is a data object including at least one logical layer in which information about exposure conditions applied according to regions on a substrate is specified. Then, when pieces of geometrical information corresponding to regions obtained by dividing a plane of the substrate are defined as windows, pieces of information about the exposure conditions applied to such windows are specified in each layer.

First, generation of the layer will be described.

Figure 1:
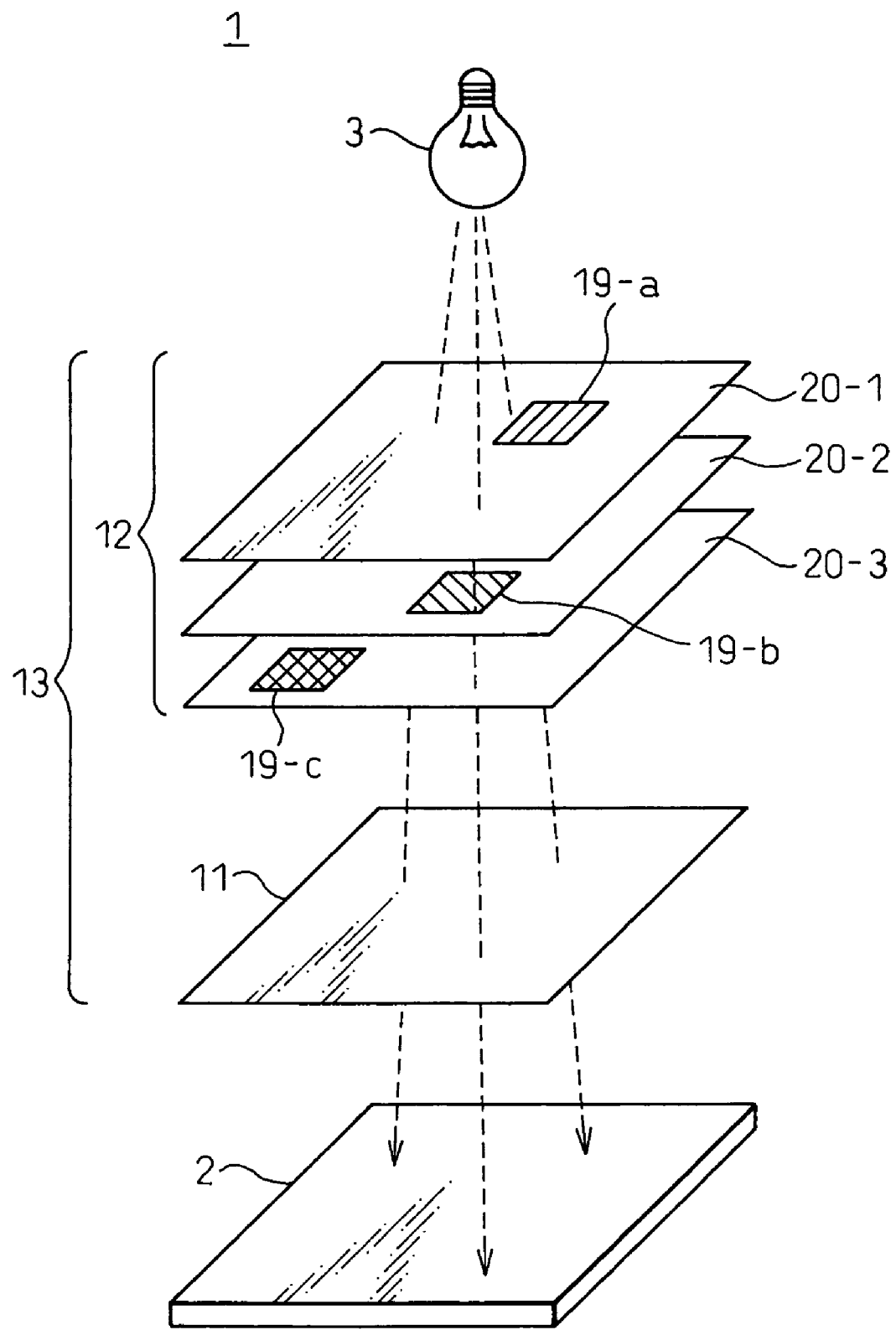
FIG. 1 is a conceptual diagram for describing a principle of a direct exposure system of the present invention.
Figure 2:
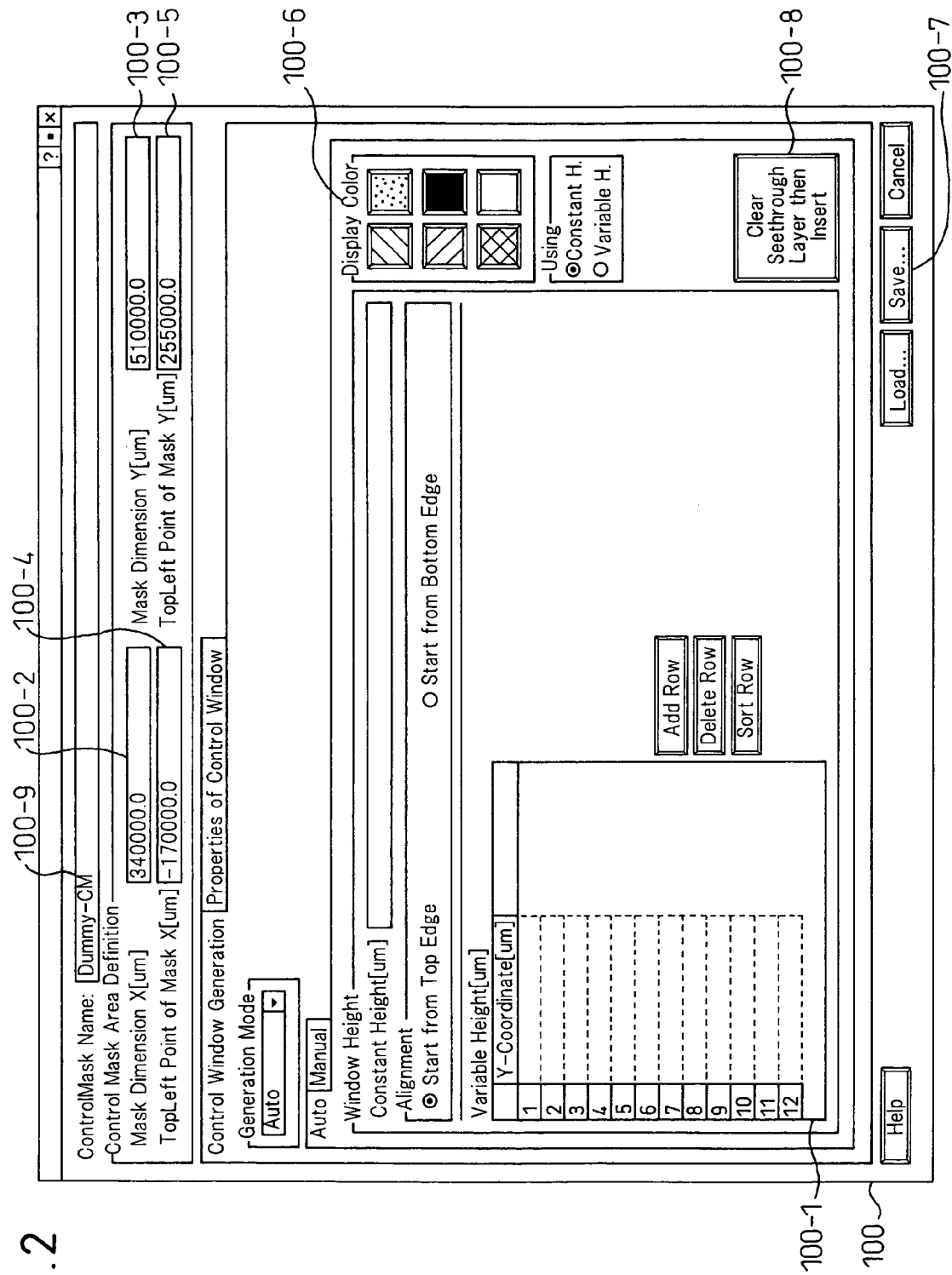
FIG. 2 is a diagram illustrating a screen for configuring windows in an embodiment of the present invention.

FIG. 2 is a diagram illustrating a screen for configuring windows in an embodiment of the present invention.

A screen 100 that is displayed on a computer display and illustrated in FIG. 2 is a graphical user interface (GUI) used for configuring the dimensions of the windows and the exposure conditions to be applied to such windows.

For example, when exposure engines are implemented using Digital Micromirror Devices (DMD), the windows corresponding to the regions obtained by dividing the plane of the substrate to be exposed may ideally have sizes of one or more pixels. However, in view of actual use, the windows having sizes about as large as a region that can be exposed by one exposure engine may be convenient.

As shown in FIG. 2, the dimensions of the layer along the X-axis and Y-axis are defined in areas 100-2 and 100-3, respectively. The dimensions of the windows are defined in area 100-1. The coordinate points for specifying the positions of the windows disposed on the layer are defined in areas 100-4 and 100-5.

The windows immediately after they are generated are in a state in which default exposure conditions of the main devices of the direct exposure system (hereinafter referred to as "global exposure conditions") are applied. In this specification, the layer in this state is referred to as a "transparent layer", which will be described in detail later.

In area 100-6, buttons for the applicable exposure conditions, which have different display colors or patterns for each exposure condition, are listed. These exposure conditions may be specified in advance. Specific examples of parameters of the exposure conditions will be described later.

Figure 3:
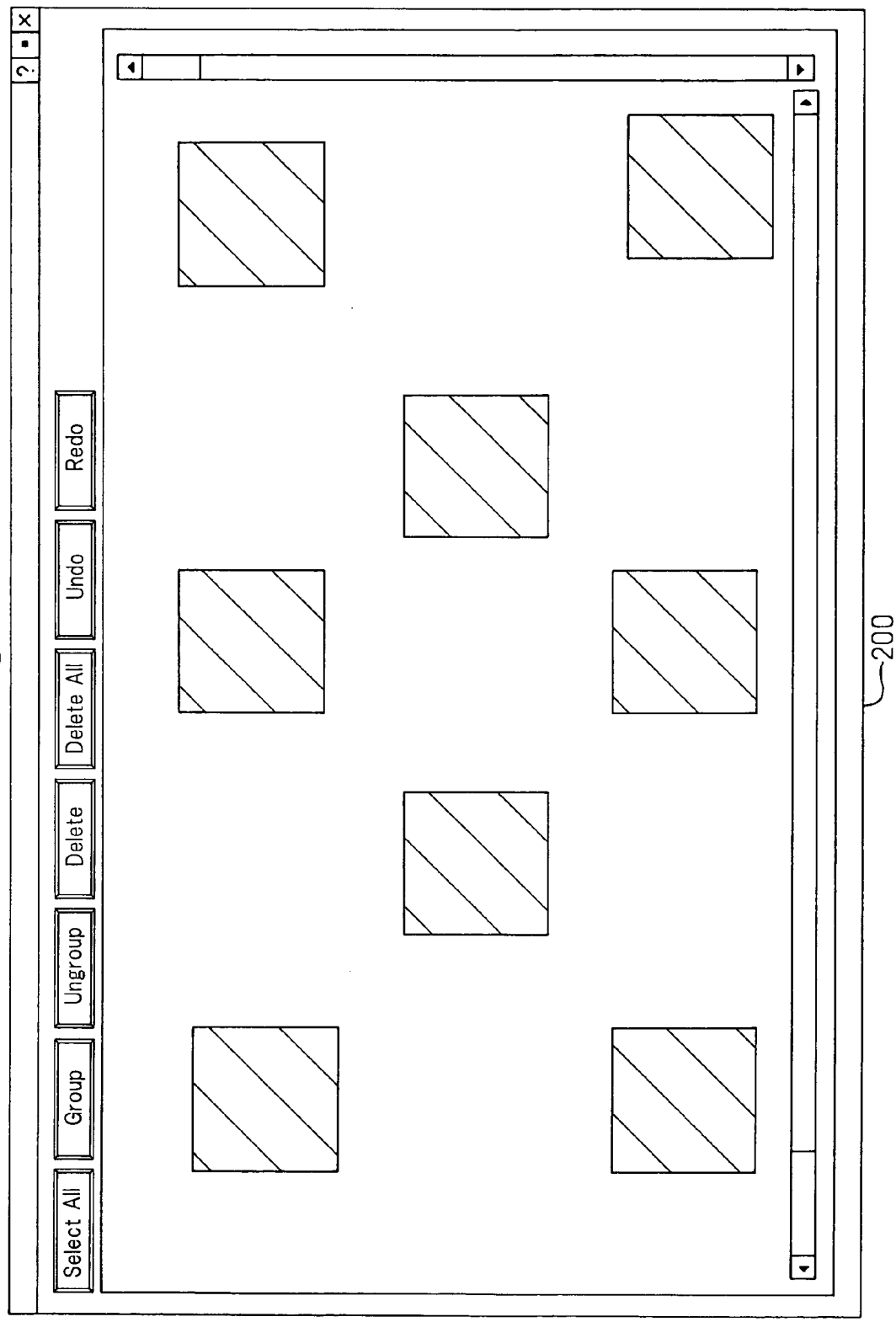
FIG. 3 is a diagram illustrating a screen (1) in which a generated layer is shown in an embodiment of the present invention.
Figure 4:
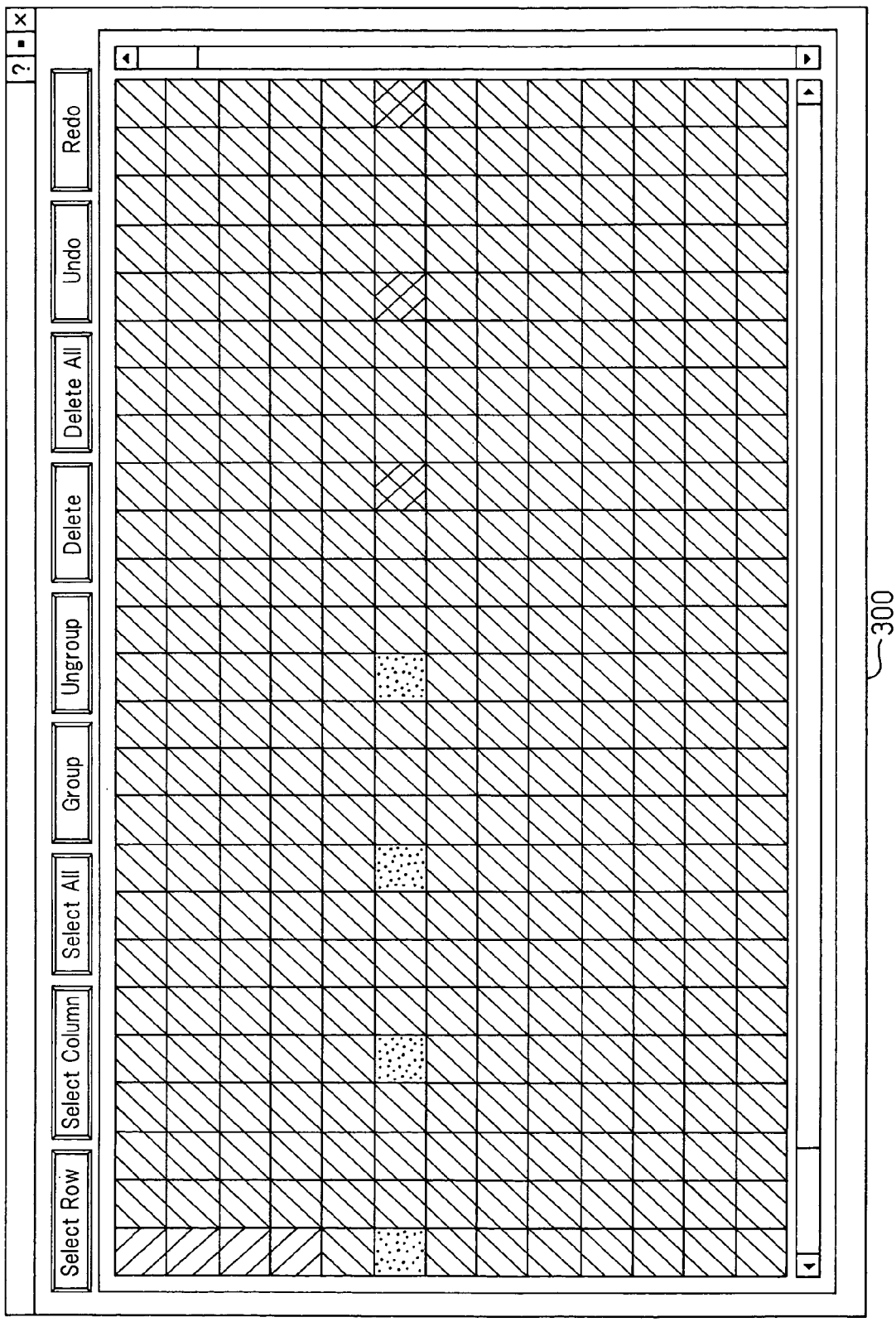
FIG. 4 is a diagram illustrating a screen (2) in which a generated layer is shown in an embodiment of the present invention.

After desired exposure conditions are selected for the generated layer from the exposure conditions listed in area 100-6, the layer, in which the information about the exposure conditions applied to each window is specified, is completed. At this time, the windows, which have the same display color or pattern as the selected buttons, are displayed on the display as shown in FIGS. 3 and 4 described below. As the display colors or patterns on the display are different for each exposure condition, the exposure conditions of each window can be distinguished easily when the layer is displayed on the display. Further, an identification name of the generated control mask may be input into area 100-9. This state can be saved by pressing "Save" button 100-7. Further, the set state can be cleared and returned to the state of the transparent layer by pressing button 100-8.

FIGS. 3 and 4 are diagrams illustrating screens in which generated layers are shown in an embodiment of the present invention. FIG. 3 shows a screen 200 when a plurality of windows are disposed on the layer and FIG. 4 shows a screen 300 when windows are disposed over the entire layer.

Figure 5:
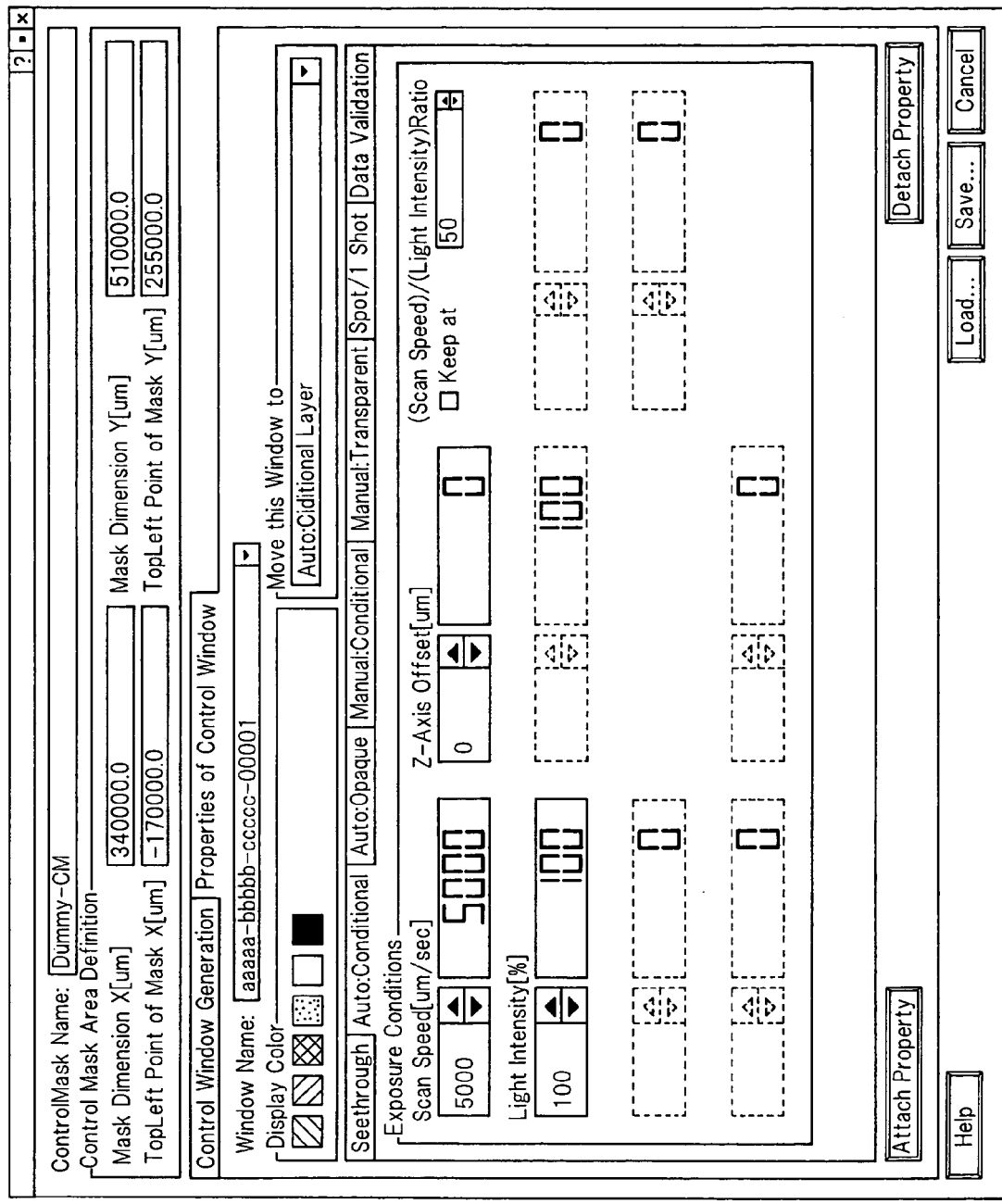
FIG. 5 is a diagram illustrating a screen for specifying exposure conditions in an embodiment of the present invention.

FIG. 5 is a diagram illustrating a screen for specifying exposure conditions in an embodiment of the present invention.

Examples of the applicable conditions, the buttons for which are listed in area 100-6 of FIG. 2, may include: a parameter for relative velocity of the direct exposure system with respect to the substrate; a parameter for intensity of an exposure light source of the direct exposure system; a parameter for a focal length of the light source; a parameter for synchronization timing of each exposure engine when the direct exposure system is provided with a plurality of exposure engines; a parameter for adjusting overlapped portions of the regions that can be processed by each exposure engine when the direct exposure system is provided with a plurality of exposure engines; a parameter for lighting time of the light source; and a parameter for operating time of the exposure engines and, further, other parameters may be included. These parameters may be specified in a screen 400 of FIG. 5.

There can be various exposure conditions suitable for various usage circumstances, purposes and the like of the direct exposure system. Therefore, it is convenient to specify particularly frequently used exposure conditions in advance and store them as specific layers. As such specific layers, a transparent layer, an autoexposure layer, a manual exposure layer, a spot exposure layer, a data mask validation layer and so on are prepared in this embodiment and, now, these layers will be described in detail.

Figure 6:
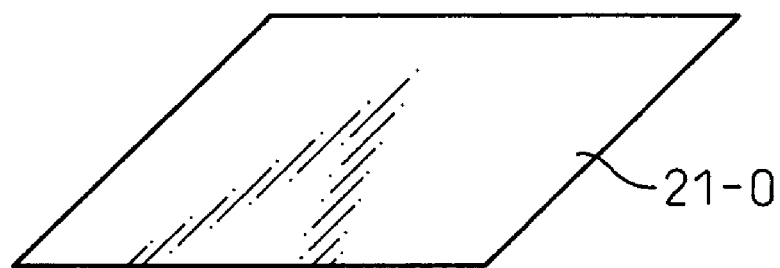
FIG. 6 is a conceptual diagram of a transparent layer in an embodiment of the present invention.

FIG. 6 is a conceptual diagram of a transparent layer in an embodiment of the present invention.

The transparent layer 21-0 is a logical layer in which default exposure conditions are applied to all windows on the layer. In the present invention, direct exposure is performed using integrated data that is obtained by combining a data mask with a control mask and, when the control mask is constituted only by transparent layers, the global exposure conditions are applied to the entire data mask. Therefore, constituting the control mask only by the transparent layer 21-0 is equivalent to direct exposure using only the data file without the control mask. In other words, it can be said that the transparent layer 21-0 is a "virtually transparent layer".

Figure 7:
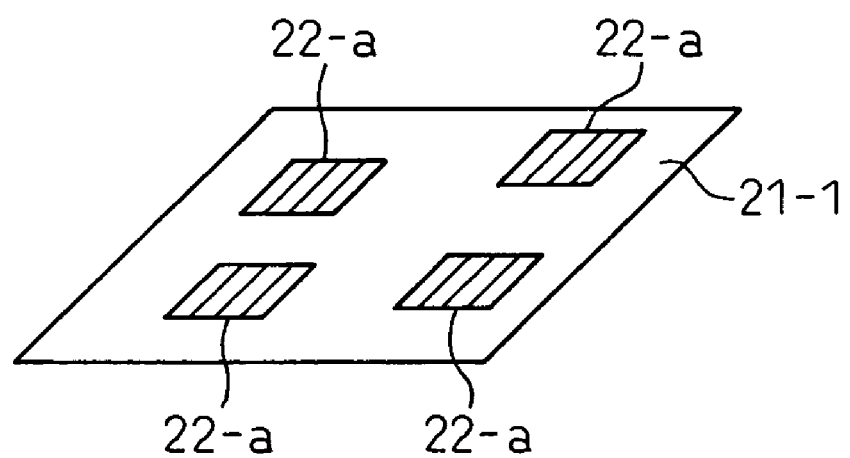
FIG. 7 is a conceptual diagram of an autoexposure layer in an embodiment of the present invention.

FIG. 7 is a conceptual diagram of an autoexposure layer in an embodiment of the present invention.

The autoexposure layer 21-1 is a logical layer suitable for determining conditions of the direct exposure process. The autoexposure layer 21-1 has a predetermined number of variable condition windows 22-a at predetermined positions on the layer. In the variable condition windows 22-a, at least one of the parameter for relative velocity of the direct exposure system with respect to the substrate, the parameter for intensity of the exposure light source of the direct exposure system, and the parameter for a focal length of the light source can be changed from the default exposure conditions (that is to say, the global exposure conditions). In the region other than the variable condition windows 22-a on the layer, the global exposure conditions are applied.

When an autoexposure layer 21-1 is constituted by providing a plurality of variable condition windows 22-a on the one logical layer so that each of the variable condition windows 22-a has different conditions from one another, for example, and a direct exposure process is performed by using the autoexposure layer 21-1 as a control mask, various exposure conditions can be implemented on one substrate. As a result, as an exposure process, in which each region has different exposure conditions at the same time, can be performed at one time with regard to one data mask, the various exposure conditions can be compared on one substrate and, therefore, cost, effort and time for the process for determining the exposure conditions can be reduced.

Figure 8:
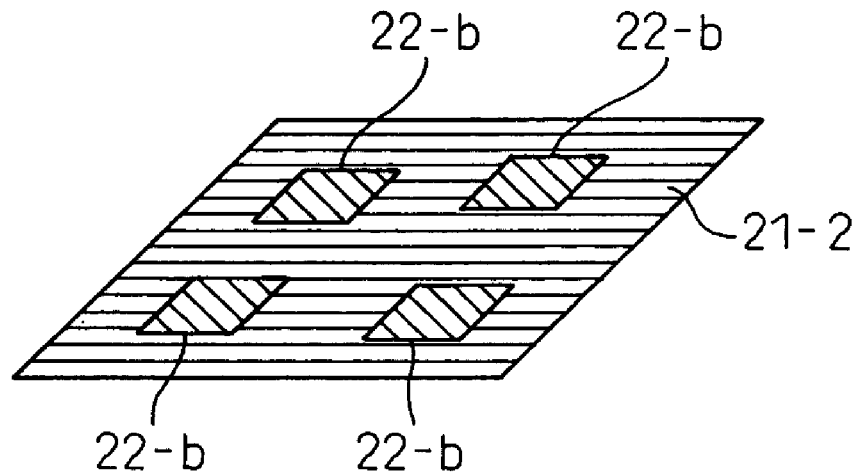
FIG. 8 is a conceptual diagram of a manual exposure layer in an embodiment of the present invention.

FIG. 8 is a conceptual diagram of a manual exposure layer in an embodiment of the present invention.

The manual exposure layer 21-2 is a logical layer suitable to be used when devices in the direct exposure system are adjusted. The manual exposure layer 21-2 has a predetermined number of variable condition windows 22-b at predetermined positions on the layer. In the variable condition windows 22-b, at least one of the parameter for relative velocity of the direct exposure system with respect to the substrate, the parameter for intensity of the exposure light source of the direct exposure system, the parameter for a focal length of the light source, the parameter for synchronization timing of each exposure engine when the direct exposure system is provided with a plurality of exposure engines, the parameter for adjusting overlapped portions of the regions that can be processed by each exposure engine when the direct exposure system is provided with a plurality of exposure engines, the parameter for lighting time of the light source, and the parameter for operating time of the exposure engines can be changed from the global exposure conditions. The region other than the variable condition windows 22-b on the layer is configured as a "virtually opaque" region and the direct exposure process by the direct exposure system is prohibited in the region on the exposed substrate corresponding to this virtually opaque region and, thus, such a region is not exposed.

When the main devices of the direct exposure system are adjusted manually, an exposure process in which each region has different exposure conditions can be implemented at one time by performing the direct exposure process using a control mask constituted by the manual exposure layer in which the above parameters are set appropriately, the various exposure conditions can be compared on one substrate and, therefore, an optimal state of the devices can be obtained in a short time.

In this connection, among the parameters mentioned above, the parameter for synchronization timing of each exposure engine when the direct exposure system is provided with a plurality of exposure engines functions to adjust synchronization of the plurality of exposure engines provided together.

Further, as a region that can be processed by one exposure engine is limited, the direct exposure system is typically provided with a plurality of exposure engines so that the regions that can be processed by each exposure engine are overlapped and an entire substrate is evenly subjected to direct exposure. The parameter for adjusting overlapped portions of the regions that can be processed by each exposure engine when the direct exposure system is provided with a plurality of exposure engines is a tuning parameter for the overlapped regions.

Still further, the parameter for lighting time of the light source specifies that the light source illuminates continuously or specifies the time to turn the light source on or off when the light source is turned on or off at a predetermined time interval.

Still further, the parameter for the operating time of the exposure engines specifies the time to turn on DMD mirrors when the exposure engines use Digital Micromirror Devices (DMD), for example.

Figure 9:
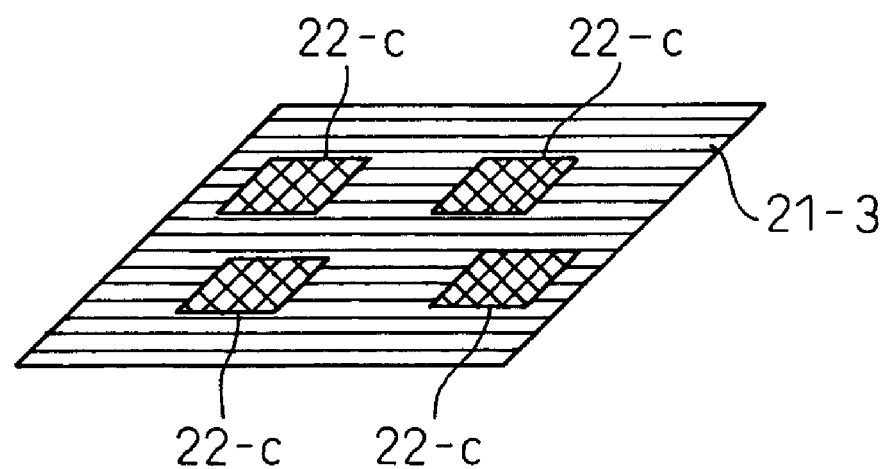
FIG. 9 is a conceptual diagram of a spot exposure layer in an embodiment of the present invention.

FIG. 9 is a conceptual diagram of a spot exposure layer in an embodiment of the present invention.

The spot exposure layer 21-3 is a logical layer suitable to be used in the maintenance and inspection of the light source of the direct exposure system. The spot exposure layer 21-3 has a predetermined number of variable condition windows 22-c at predetermined positions on the layer. In the variable condition windows 22-c, at least one of the parameter for intensity of the exposure light source of the direct exposure system, the parameter for a focal length of the light source, the parameter for synchronization timing of each exposure engine when the direct exposure system is provided with a plurality of exposure engines, the parameter for adjusting overlapped portions of the regions that can be processed by each exposure engine when the direct exposure system is provided with a plurality of exposure engines, the parameter for lighting time of the light source, and the parameter for operating time of the exposure engines can be changed from the global exposure conditions.

Further, in the spot exposure layer 21-3, the parameter for relative velocity of the direct exposure system with respect to the substrate is set so that the relative velocity is zero.

The region other than the variable condition windows 22-*c* on the layer is configured as a "virtually opaque" region and the direct exposure process by the direct exposure system is prohibited in the region on the exposed substrate corresponding to this virtually opaque region and, thus, such a region is not exposed.

When the maintenance and inspection of the light source of the direct exposure system is performed, the direct exposure process is performed using a control mask constituted by the spot exposure layer in which the above parameters are set appropriately. At this time, a pattern on one exposed substrate, to which various exposure conditions are applied, can be observed and, further, as the light source does not move with respect to the substrate, the position of the light source can be easily identified. For example, in the direct exposure system using the DMD, in which one exposure engine has 800,000-1,000,000 pixels, it is checked whether each one of the pixels functions normally or not. More specifically, a CCD camera is introduced into the image-forming plane of the light source of the exposure engine and it is checked whether each pixel lights up or not by the CCD camera.

Figure 10:
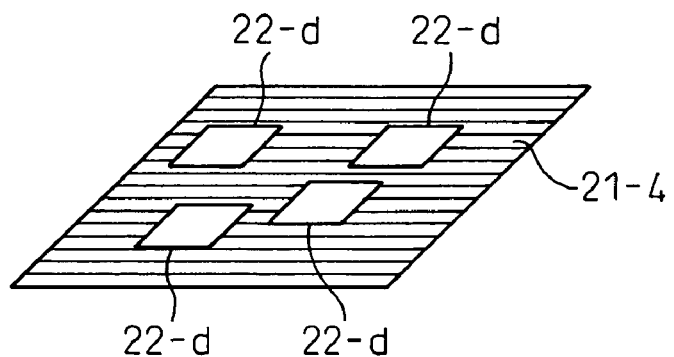
FIG. 10 is a conceptual diagram of a data mask validation layer in an embodiment of the present invention.

FIG. 10 is a data mask validation layer in an embodiment of the present invention.

The data mask validation layer 21-4 is a logical layer suitable to be used when drawing data in the data mask supplied to the exposure engines of the direct exposure system is validated.

When a control mask constituted by the data mask validation layer 21-4 is used, the exposure process is not actually performed. The data mask validation layer 21-4 has a predetermined number of transparent windows 22-*d* at predetermined positions on the layer.

The region other than the transparent windows 22-*d* on the layer is configured as a "virtually opaque" region and the drawing data in the data mask corresponding to such region is not validated.

As the transparent window 22-*d* holds only geometrical information about the dimensions and coordinates of the windows, based on this information, drawing data in the data mask corresponding to the transparent windows 22-*d* is extracted by a plurality of data processing systems (not shown) and it is determined whether the drawing data included in the data mask is true or not by comparing the extracted data between the plurality of data processing systems. Therefore, if there is a portion of the drawing data included in the data mask that is desired to be validated, a transparent window 22-*d* having appropriate dimensions may be set at the position on the data mask validation layer 22-4 corresponding to the portion.

Though each of the transparent layer, the autoexposure layer, the manual exposure layer, the spot exposure layer and the data mask validation layer in the embodiment described above may be conveniently used as a control mask separately, the control mask may be constituted by combining these layers so long as their exposure conditions are not in conflict with one another. Further, logical layers other than those described here may be prepared in advance in consideration of the usage circumstances, the purposes, and the like, of the direct exposure system.

Integrated data is generated by superimposing the control mask constituted by the layer(s) as described above on the data mask virtually. Then, the direct exposure system performs an exposure process according to the integrated data. From the viewpoint of the processing computer of the direct exposure system, the exposure conditions specified in the windows on the layer(s) in the control mask are equivalent to so-called "events". As a result of the fact that these events are arranged on the data object chronologically and the substrate is exposed while it moves with respect to the exposure engines, a drawing pattern depending on various exposure conditions for one type of drawing data can be implemented in one exposure process. In such usage, the control mask and the data mask are independent of each other and the drawing data included in the data mask is not changed. Therefore, in this specification, such usage is referred to as "static use of the control mask".

In contrast to this, a logical layer for changing the drawing data included in the data mask may be implemented. In this specification, such logical layer is referred to as a "data changing layer" and using the control mask constituted by the data changing layer in the direct exposure is referred to as "dynamic use of the control mask".

In the dynamic use of the control mask, information from the control mask constituted by the data changing layer is reflected in the drawing data included in the data mask. Thus, geometrical characteristics of the pattern to be exposed are changed dynamically according to the information from the control mask and, therefore, patterning can be performed with higher accuracy.

As an example of such data changing layer, a reduction layer will be described.

Figure 11:
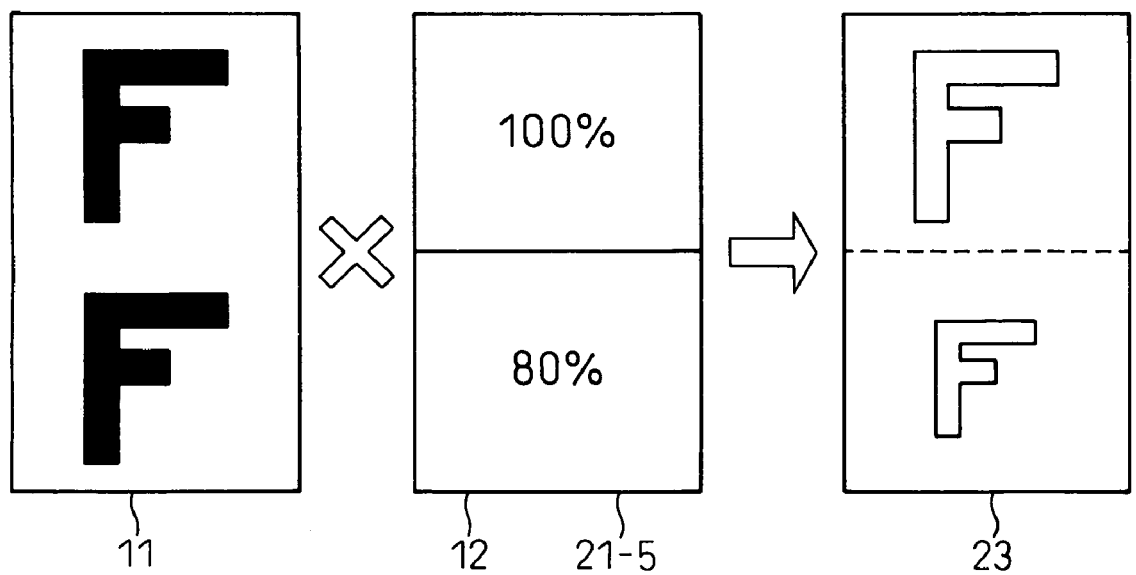
FIG. 11 is a schematic diagram for describing a concept of a reduction layer in an embodiment of the present invention.

FIG. 11 is a schematic diagram for describing a concept of a reduction layer in an embodiment of the present invention.

The reduction layer 21-5 is a logical layer that processes data in a data mask so that the pattern to be obtained when the exposure process is performed is reduced. In the reduction layer 21-5 shown in FIG. 11, the reduction ratio of one half of its region is set to 100% and the reduction ratio of other half is set to 80%, for example. When integrated data is generated by superimposing a control mask 12 constituted by such reduction layer 21-5 on the data mask 11 and, then, direct exposure process is performed using this integrated data, a substrate 23 having a pattern, a part of which is reduced to 80% of its default size, is obtained.

The control mask 12 may be constituted by combining this reduction layer 21-5 with the transparent layer 21-0, the autoexposure layer 21-1, the manual exposure layer 21-2, the spot exposure layer 21-3 or the data mask validation layer 24-4 described above so long as their exposure conditions do not conflict with one another. For example, when the control mask 12 is constituted by combining the reduction layer 21-5 with the autoexposure layer 21-1, an exposure such as "to increase the dose of exposure to 125% in one region while reducing it to 80% in the other region" becomes possible.

In the manufacturing of semiconductors or IC packages, as manufacturing technology of a given generation becomes stable, substrates shrink for the sake of increasing integration degree or density or yields. Even after the shrinking, it is desirable that the manufacturing process can be performed on the same conditions as those before the shrink. By using the reduction layer, such circumstances can be accommodated flexibly.

Further, though the logical layer for reducing drawing data included in the drawing mask geometrically has been described as an example of the data changing layer, the data changing layer may be other logical layers, such as for geometrical expansion, circuit modification and the like.

Figure 12:
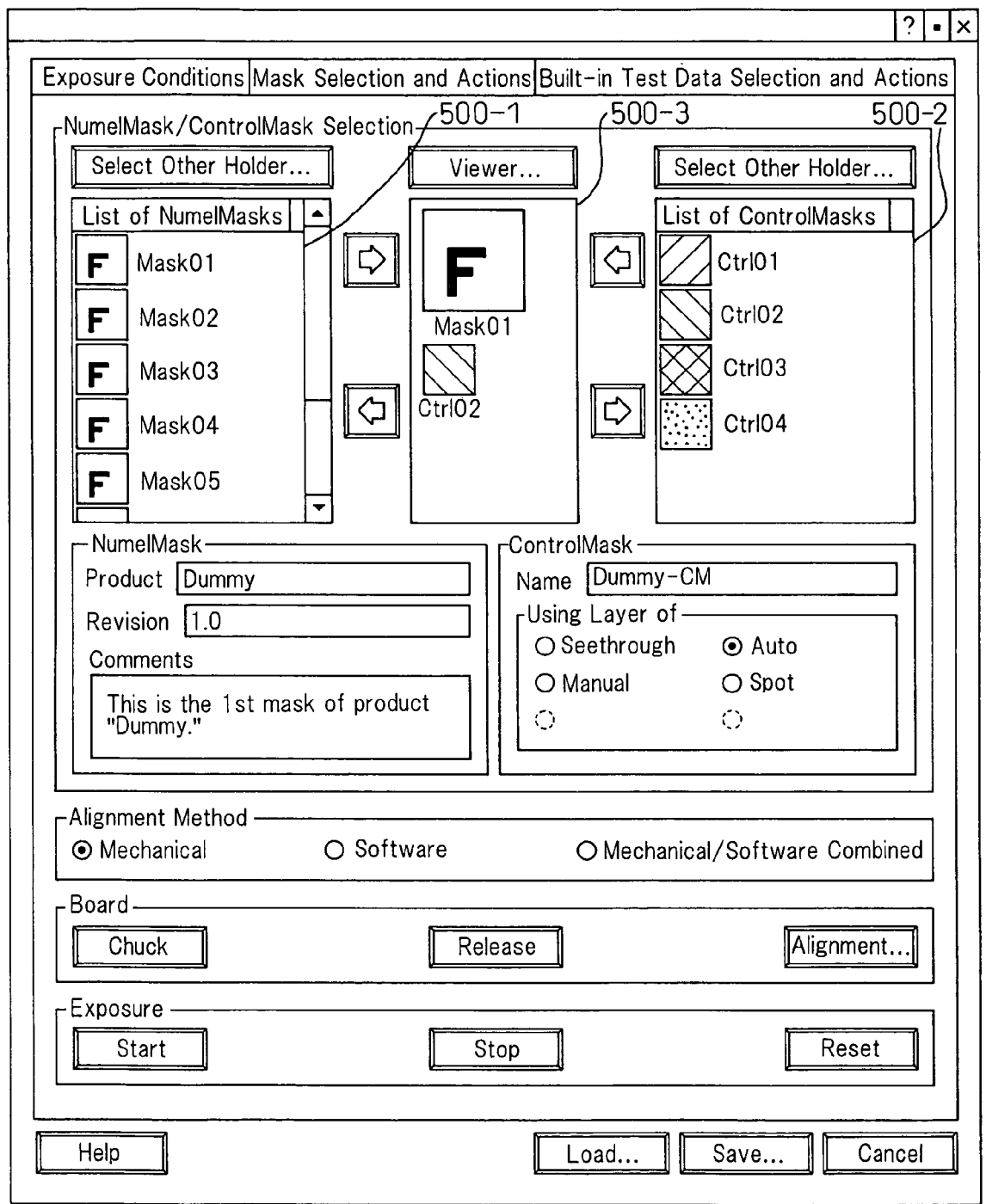
FIG. 12 is a diagram illustrating a screen for generating integrated data in an embodiment of the present invention.

FIG. 12 is a diagram illustrating a screen for generating integrated data in an embodiment of the present invention.

The screen 500 that is displayed on a computer display and illustrated in FIG. 12 is a graphical user interface for selecting a data mask and a control mask and generating integrated data used for a direct exposure process.

The graphical user interface designated as the screen 500 is provided with a first field 500-1, a second field 500-2 and a third field 500-3.

In the first field 500-1, at least one selectable data mask is listed as "List of NumelMask" in the form of a corresponding icon.

In the second field 500-2, at least one selectable control mask is listed in the form of a corresponding icon. As described earlier, it is convenient to prepare layers specified for frequently used exposure conditions or layers specified for particular uses in advance and, then, generate and store control masks each of which is provided with at least one such layer. In this embodiment, icons corresponding to the control masks that are generated and stored in advance are displayed in the second field 500-2.

The data mask icon selected from the first field 500-1 and the control mask icon selected from the second field 500-2 may be accommodated in the third field 500-3. A user selects the icon corresponding to a desired data mask from the first field 500-1 and puts it into the third field 500-3 and selects the icon corresponding to a desired control mask from the second field 500-2 and puts it into the third field 500-3 by pressing arrow buttons shown. In this embodiment, integrated data is generated by combining the data mask and the control mask, which correspond to the data mask icon and the control mask icon accommodated in the third field 500-3, respectively.

As described above, when a graphical user interface such as the screen 500 is used, the user can implement a desired exposure process simply by selecting desired data mask and control mask from a plurality of data masks and control masks prepared in advance and putting them into a predetermined field and, therefore, to operate the direct exposure system more easily. In this connection, though the screen 500 shown in FIG. 12 is merely an example and positions at which the first field 500-1, the second field 500-2 and the third field 500-3 are disposed are not limited particularly, the positions shown in FIG. 12 are preferred examples thereof.

According to the present invention, as exposure conditions can be set in every window, a direct exposure process in which various exposure conditions are applied to one substrate can be implemented at a time.

Further, by defining the virtual masks as described above, there is provided a user interface through which an intuitively understandable image can be obtained as if one virtual mask in which the manufacturing conditions are specified (that is, the "control mask") and the other virtual mask including the original drawing data (that is, the "data mask") are superimposed on each other and, then, light emitted from a light source is applied from above and a desired pattern is formed on a substrate through these two superimposed masks.

Still further, according to the present invention, as a direct exposure process in which various exposure conditions are applied to one substrate can be implemented, the need to expose a plurality of substrates for determining exposure conditions in the conventional technique can be eliminated and, therefore, cost can be reduced. Further, the various exposure conditions can be compared on one substrate easily and, therefore, effort and time for the process for determining the exposure conditions can be reduced.

Still further, if plural types of layers in which information about the exposure conditions applied to each window are prepared in advance, a user can select desired exposure conditions easily. In particular, if a plurality of users operates the direct exposure system, the exposure conditions desired by each user may be prepared in advance. As described above, according to the present invention, the exposure conditions to be applied can be set easily.

In a direct exposure system used for manufacturing circuit boards, the user interface for the direct exposure system according to the present invention can achieve an optimal state easily in various uses such as determination of exposure conditions (conditioning) before mass production of the boards, adjustment of entire devices, inspection of light sources for exposure engines, validation of data used for exposure, and the like.

What is claimed is:

1. A direct exposure system that performs a direct exposure process using drawing data for forming a desired exposure pattern on a substrate, comprising:
    a data mask that is a data object including said drawing data; and
    a control mask that is a data object including at least one logical layer in which information about exposure conditions applied according to regions on the substrate is specified,
    wherein the direct exposure system performs a desired direct exposure process using integrated data generated by combining said data mask with said control mask,
    wherein, when pieces of geometrical information corresponding to regions obtained by dividing a plane of said substrate are defined as windows, pieces of information about the exposure conditions applied to said windows are specified in said layer,
    wherein said exposure conditions specified in said layer are set by using parameters selected from:
        a first parameter for relative velocity of said direct exposure system with respect to said substrate;
        a second parameter for intensity of an exposure light source of said direct exposure system;
        a third parameter for a focal length of said light source;
        a fourth parameter for synchronization timing of each exposure engine when said direct exposure system is provided with a plurality of exposure engines;
        a fifth parameter for adjusting overlapped portions of the regions that can be processed by each exposure engine when said direct exposure system is provided with a plurality of exposure engines;
        a sixth parameter for lighting time of said light source; and
        a seventh parameter for operating time of said exposure engines.

2. A direct exposure system according to claim 1, comprising a graphical user interface that displays on a display screen: a first field in which at least one said selectable data mask is listed in the form of a corresponding icon; a second field in which at least one said selectable control mask is listed in the form of a corresponding icon, and a third field in which said selected data mask icon and said selected control mask icon may be accommodated,
    wherein said integrated data is generated by combining said data mask and said control mask corresponding to said data mask icon and said control mask icon accommodated in said third field, respectively.

3. A direct exposure system according to claim 1, comprising said layer having: said windows to which a default of said exposure conditions is applied; and said windows to which said exposure conditions, in which at least one of said first parameter, said second parameter and said third parameter can be changed from said default exposure conditions, is applied.

4. A direct exposure system according to claim 3, wherein said layer is used as an autoexposure layer that is used when the conditions of said direct exposure process are determined.

5. A direct exposure system according to claim 1, comprising said layer having: said windows to which said exposure conditions, in which at least one of said first parameter, said second parameter, said third parameter, said fourth parameter, said fifth parameter, said sixth parameter and said seventh parameter can be changed, are applied; and said windows to which an exposure condition that prohibits the direct exposure process of said direct exposure system is applied.

6. A direct exposure system according to claim 5, wherein said layer is used as a manual exposure layer that is used when devices in said direct exposure system are adjusted.

7. A direct exposure system according to claim 1, comprising said layer having: said windows to which said exposure conditions, in which the relative velocity is set to zero in said first parameter and, then, at least one of said second parameter, said third parameter, said fourth parameter, said fifth parameter, said sixth parameter and said seventh parameter can be changed, are applied; and said windows to which an exposure condition that prohibits the direct exposure process of said direct exposure system is applied.

8. A direct exposure system according to claim 7, wherein said layer is used as a spot exposure layer that is used when said light source of said direct exposure system is maintained and inspected.

9. A direct exposure system according to claim 1, comprising said layer having: said windows to which a default of said exposure conditions is applied; and said windows to which an exposure condition that prohibits the direct exposure process of said direct exposure system is applied.

10. A direct exposure system according to claim 9, wherein said layer is used as a data mask validation layer that is used when data supplied to said exposure engines of said direct exposure system is validated.

11. A direct exposure system according to claim 1, wherein said control mask further comprises a data mask changing layer for changing said drawing data included in said data mask.

12. A user interface that allows a direct exposure system to perform a direct exposure process using drawing data for forming a desired exposure pattern on a substrate, comprising:
  a data mask that is a data object including said drawing data; and
  a control mask that is a data object including at least one logical layer in which information about exposure conditions applied according to regions on the substrate is specified,
  wherein the user interface allows said direct exposure system to perform a desired direct exposure process using integrated data generated by combining said data mask with said control masks,
  wherein, when pieces of geometrical information corresponding to regions obtained by dividing a plane of said substrate are defined as windows, pieces of information about the exposure conditions applied to said windows are specified in said layer,
  wherein said exposure conditions specified in said layer are set by using parameters selected from:
    a first parameter for relative velocity of said direct exposure system with respect to said substrate;
    a second parameter for intensity of an exposure light source of said direct exposure system;
    a third parameter for a focal length of said light source;
    a fourth parameter for synchronization timing of each exposure engine when said direct exposure system is provided with a plurality of exposure engines;
    a fifth parameter for adjusting overlapped portions of the regions that can be processed by each exposure engine when said direct exposure system is provided with a plurality of exposure engines;
    a sixth parameter for lighting time of said light source; and
    a seventh parameter for operating time of said exposure engines.

13. A user interface according to claim 12, comprising a graphical user interface that displays on a display screen: a first field in which at least one said selectable data mask is listed in the form of a corresponding icon; a second field in which at least one said selectable control mask is listed in the form of a corresponding icon, and a third field in which said selected data mask icon and said selected control mask icon may be accommodated,
  wherein said integrated data is generated by combining said data mask and said control mask corresponding to said data mask icon and said control mask icon accommodated in said third field, respectively.

14. A user interface according to claim 12, comprising said layer having: said windows to which a default of said exposure conditions is applied; and said windows to which said exposure conditions, in which at least one of said first parameter, said second parameter and said third parameter can be changed from said default exposure conditions, is applied.

15. A user interface according to claim 14, wherein said layer is used as an autoexposure layer that is used when the conditions of said direct exposure process are determined.

16. A user interface according to claim 12, comprising said layer having: said windows to which said exposure conditions, in which at least one of said first parameter, said second parameter, said third parameter, said fourth parameter, said fifth parameter, said sixth parameter and said seventh parameter can be changed, are applied; and said windows to which an exposure condition that prohibits the direct exposure process of said direct exposure system is applied.

17. A user interface according to claim 16, wherein said layer is used as a manual exposure layer that is used when devices in said direct exposure system are adjusted.

18. A user interface according to claim 12, comprising said layer having: said windows to which said exposure conditions, in which the relative velocity is set to zero in said first parameter and, then, at least one of said second parameter, said third parameter, said fourth parameter, said fifth parameter, said sixth parameter and said seventh parameter can be changed, are applied; and said windows to which an exposure condition that prohibits the direct exposure process of said direct exposure system is applied.

19. A user interface according to claim 18, wherein said layer is used as a spot exposure layer that is used when said light source of said direct exposure system is maintained and inspected.

20. A user interface according to claim 12, comprising said layer having: said windows to which a default of said exposure conditions is applied; and said windows to which an exposure condition that prohibits the direct exposure process of said direct exposure system is applied.

21. A user interface according to claim 20, wherein said layer is used as a data mask validation layer that is used when data supplied to said exposure engines of said direct exposure system is validated.

22. A user interface according to claim 12, wherein said control mask farther comprises a data mask changing layer for changing said drawing data included in said data mask.

* * * * *